United States Patent [19]

Fujita et al.

[11] Patent Number: 5,643,654

[45] Date of Patent: Jul. 1, 1997

[54] PELLICLE STRUCTURE AND PROCESS FOR PREPARATION THEREOF WITH DISSOLUTION OF COATING LAYER

[75] Inventors: Minoru Fujita; Hiroaki Nakagawa, both of Waki; Tsutomu Saito, Fuchu, all of Japan

[73] Assignee: Mitsui Petrochemical Industries, Ltd., Tokyo, Japan

[21] Appl. No.: 801,500

[22] Filed: Nov. 27, 1991

[30] Foreign Application Priority Data

Nov. 29, 1990 [JP] Japan .................................. 2-331499

[51] Int. Cl.⁶ .............................. G03B 27/28; B32B 3/24
[52] U.S. Cl. .......................... 428/138; 428/14; 428/68; 428/344; 428/346; 428/349; 428/355 AC; 428/421; 428/510; 428/520; 428/192; 428/422; 428/212; 156/108; 156/308.6; 430/5; 355/30; 427/264; 427/265; 427/270
[58] Field of Search .............................. 428/14, 138, 68, 428/344, 346, 349, 355, 421, 510, 520, 192, 422, 212; 156/108, 308.6; 430/5; 355/30; 427/264, 265, 270

[56] References Cited

U.S. PATENT DOCUMENTS

| 4,634,270 | 1/1987 | Yokoo et al. ........................ 355/30 |
| 4,657,805 | 4/1987 | Fukumitsu et al. ................. 428/215 |
| 4,828,640 | 5/1989 | Kaya et al. ......................... 156/267 |
| 4,861,402 | 8/1989 | Gordon ............................... 156/108 |
| 4,878,973 | 11/1989 | Ohtake et al. ..................... 156/108 |
| 4,970,099 | 11/1990 | Adams et al. ....................... 428/76 |
| 4,996,106 | 2/1991 | Nakagawa et al. ................. 428/422 |
| 5,059,451 | 10/1991 | Ayou et al. ......................... 427/164 |
| 5,061,024 | 10/1991 | Keys ................................... 359/892 |
| 5,085,899 | 2/1992 | Nakagawa et al. ................. 428/45 |
| 5,100,957 | 3/1992 | Oshima et al. ..................... 525/61 |

FOREIGN PATENT DOCUMENTS

| 63-108036 | 5/1988 | Japan . |
| 1120535 | 5/1989 | Japan . |
| 1262548 | 10/1989 | Japan . |

*Primary Examiner*—William Watkins
*Attorney, Agent, or Firm*—Sherman and Shalloway

[57] ABSTRACT

A pellicle structure comprises a frame having a vertical through opening and a pellicle film spread on the upper the upper end of the opening of the frame. The pellicle film has a coating layer comprising a coating agent formed at least on the inner surface thereof, and a bonding portion for bonding the end edge of the frame to the peripheral edge of the pellicle film through an adhesive layer. The coating agent, in the bonding portion, is dissolved or dispersed in the adhesive so that the pellicle substrate is directly contacted by and bonded to the adhesive. In forming this pellicle structure, an adhesive, capable of dissolving therein the coating agent which comprises the coating layer, is coated on the top end of the opening of the frame; the adhesive is contacted with the coating layer on the surface of the pellicle substrate, whereby the coating agent dissolves in the adhesive allowing direct contact of the adhesive with the pellicle substrate; and the adhesive is then cured, whereby the pellicle substrate is directly bonded to the frame without interposition of the coating layer.

8 Claims, 1 Drawing Sheet

5,643,654

PELLICLE STRUCTURE AND PROCESS FOR PREPARATION THEREOF WITH DISSOLUTION OF COATING LAYER

BACKGROUND OF THE INVENTION (1) Field of the Invention

The present invention relates to a pellicle structure and a process for the preparation thereof. More particularly, the present invention relates to a pellicle structure in which a pellicle film shows excellent performance and the pellicle film has a sufficient bonding strength to a frame, and a process for the preparation thereof.

(2) Description of the Related Art

In the production of integrated circuits such as IC and LSI, a pellicle is attached to a photomask or reticle used for forming a circuit pattern on a semiconductor substrate so that projection of the shadow of a foreign substance such as dust bonded to the pattern to be light-exposed, or to the photomask or reticle, on the pattern at the light exposure, can be prevented.

The conventional pellicle comprises a pellicle film composed of nitrocellulose or the like and a frame composed of aluminum or the like, at an upper part of which the pellicle film is spread. If the pellicle is used in a manner covering the photomask or reticle, the above-mentioned adhesion of a foreign substance to a photomask or reticle can be prevented. However, if a foreign substance is present on the pellicle film, the image of the foreign substance projected at the light exposure is not focused on the pellicle film but forms a so-called fuzzy image. Accordingly, bad influences by a foreign substance can be eliminated.

Coating layers such as an adhesive layer for preventing adhesion of an intruding foreign substance to a photomask or reticle, a reflection-preventing layer for preventing reduction of the exposure light quantity by reflection of the exposure light and an adhesive reflection-preventing layers exerting both the functions are formed in pellicles or on the inner faces of frames. However, if a pellicle film having such a coating layer is bonded to a frame, there arises a problem of reduction of the bonding strength.

In general, after a coating layer such as the above-mentioned adhesive reflection-preventing coating layer or nonadhesive reflection-preventing coating layer is formed on the entire surface of the pellicle film by spin coating or the like, a pellicle is fabricated by bonding the pellicle film to a frame by using an adhesive.

If the pellicle film having a coating layer such as a reflection-preventing layer is directly bonded to a frame as in the conventional technique, the bonding strength is low, and therefore, at the air-blowing operation conducted for removing a foreign substance from the surface of the pellicle film, the pellicle film is peeled from the frame.

SUMMARY OF THE INVENTION

It is therefore a primary object of the present invention to overcome the above-mentioned disadvantages of the conventional technique, and to provide a pellicle structure having a coating layer formed at least on the surface to be formed as the inner surface of the pellicle film, in which a sufficient bonding strength is attained between the pellicle film and frame and they are not peeled from each other even if air-blowing or the like is carried out for removing a foreign substance from the pellicle surface, and also provide a process for the preparation of this pellicle structure.

Another object of the present invention is to provide a pellicle structure in which even though a coating layer causing a trouble in the bonding is formed at least on the surface of the pellicle film to be formed as the inner surface, a sufficient bonding strength is attained between the pellicle film and frame without any additional operation such as the coating layer-removing operation, and a process for the preparation of a pellicle structure.

In accordance with one aspect of the present invention, there is provided a pellicle structure comprising a frame having a vertical through opening, a pellicle film spread on the upper end of the opening of the frame, said pellicle film having a coating layer formed at least on the inner surface thereof, and a bonding portion for bonding the end edge of the frame to the peripheral edge of the pellicle film through an adhesive layer, wherein a coating agent in the bonding portion is dissolved or dispersed in the adhesive and the pellicle film substrate is directly contacted and bonded to the adhesive.

In accordance with another aspect of the present invention, there is provided a process for the preparation of a pellicle structure, which comprises coating an adhesive, capable of dissolving therein the coating layer of a pellicle film having a coating layer formed at least on the surface to be formed as the inner surface, on the top end of the opening of a frame having a vertical through opening, contacting the adhesive-coated surface of the frame with the surface on the coating layer of the pellicle film, dissolving and removing the coating layer in the bonded portion while maintaining the contact state, and curing the adhesive on the coated surface, whereby the pellicle film is directly bonded to the frame without the interposing coating layer.

DETAILED DESCRIPTION OF THE INVENTION

Figure 1:
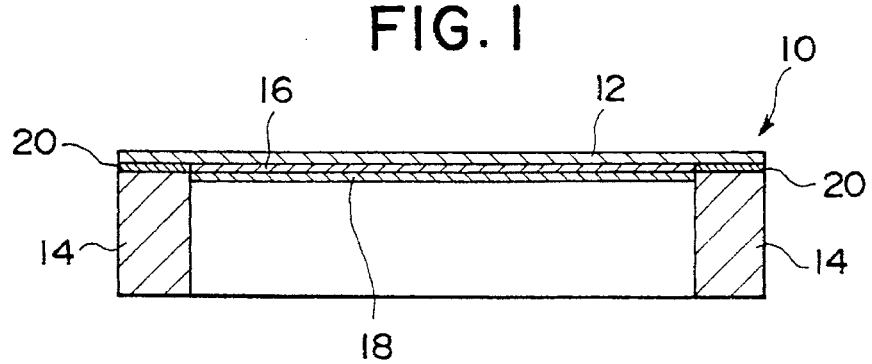
FIG. 1 is a sectional diagram illustrating an example of the pellicle structure of the present invention.

In the present invention, there is used a pellicle film having a coating layer such as an adhesive layer for preventing adhesion of a foreign substance intruding in the interior of the pellicle to a photomask or reticle, a reflection-preventing layer for preventing reduction of the exposure light quantity by reflection of the exposure light by the pellicle film or an adhesive reflection-preventing layer exerting both the functions, at least on the surface to be formed as the inner surface.

A coating layer as mentioned above reduces the bonding force between the pellicle film and the frame more or less. It should naturally be considered that the coating layer applied to the pellicle film will be removed so as to improve the bonding force between the pellicle film and the frame. This removal of the coating layer requires a troublesome treatment of removing respective coated pellicle film independently, and it is often difficult to match the coating layer-removed surface with the bonded surface.

In the present invention, the pellicle film having a coating layer formed thereon is directly bonded to the frame, and the present invention is characterized in that in the bonded portion between the end edge of the frame and the peripheral edge of the pellicle film, the coating agent is dissolved or dispersed in the adhesive layer, and the pellicle film substrate is directly contacted and bonded to the adhesive without the intervening coating layer.

By using an adhesive capable of dissolving the coating layer, at the bonding step, the coating layer is removed from the interface between the pellicle film and the frame and simultaneously, the bonding force-reducing action is moderated or eliminated and strong bonding is attained between the pellicle film and the frame.

Furthermore, according to the present invention, both removal of the coating layer and bonding are simultaneously accomplished within one step., and removal of the coating layer only from the bonded surface is appropriately effected. Therefore, the inherent adhesive action or reflection-preventing action of the coating layer of the pellicle film is not inhibited at all. This is still another advantage attained by the present invention.

The pellicle structure of the present invention and the process for the preparation thereof will now be described in detail with reference to embodiments shown in the drawings.

FIG. 1 is a sectional diagram illustrating one embodiment of the pellicle structure of the present invention.

The pellicle structure 10 shown in FIG. 1 has, in principle, a pellicle film 12 and a frame 14 having a verical through opening, on the upper end of which the pellicle film 12 is spread. A first coating layer 16 is formed on the inner surface side of the pellicle film 12 and a second coating layer 18 is formed on the first coating layer 16. In the pellicle structure 10 of the present invention, the pellicle film 12 is bonded to the frame 14 through an adhesive 20 capable of dissolving the first coating layer 16 and the second coating layer 18. At the step of bonding the pellicle film 12 to the frame 14, the coating layers are dissolved and removed from the interface of the pellicle film 12 and the frame 14 and are included into the adhesive by dissolution or dispersion, whereby the pellicle film 12 is directly bonded to the frame 14 without substantial interposition of the first coating layer 16 or the second coating layer 18.

The following description will be made with reference to embodiments having a two-layer coating comprising a first coating layer 16 and a second coating layer 18, but it must be noted that the present invention is not limited to such embodiments.

Any of films capable of being applied to the resist process of the photolithography and having a high exposed light transmission can be used as the pellicle film 12 for the pellicle structure 10 of the present invention without any particular limitation, and an appropriate pellicle film is appropriately selected and used according to the exposure light to be applied.

For example, in the case where the light exposure is carried out with rays having a wavelength of 350 to 450 nm, nitrocellulose, ethylcellulose and cellulose propionate are preferably used, and in view of the average light transmission and the film strength, nitrocellulose is especially preferably used. Nitrocellulose having a nitrification degree of 11 to 12.5%, particularly 11.5 to 12.2%, and a weight average molecular weight (Mw) of 50,000 to 350,000, particularly 70,000 to 320,000, is most preferably used.

The thickness of the pellicle film 12 is not particularly critical, but the thickness is generally 500 to 5,000 nm.

The frame 14 is a circular or square cylindrical member having a vertical through opening, and any of materials heretofore applied to conventional pellicle structures can be used. A material having an appropriate rigidity and a good dimension stability, such as alumite-treated aluminum, can be used.

The first coating layer 16 and second coating layer 18 are formed on the inner surface of the pellicle film 12 of the pellicle structure 10 of the present invention. The first coating layer 16 and second coating layer 18 (hereinafter referred to collectively as "coating layer") exert functions of such layers as an adhesive reflection-preventing layer and a non-adhesive reflection-preventing layer, that is, function of causing a foreign substance, such as dust or dirt intruding within the pellicle structure, to adhere to the coating layer and preventing reflection of the incident exposure light by the pellicle film 12, and the coating layer is a thin film layer having a high transmission to the above-mentioned exposure light.

The kind of the coating layer is not particularly critical, and coating layers heretofore used for conventional pellicle structures can be used. For example, there can be mentioned a high light-transmission adhesive substance layer of a fluorine polymer or a silicone polymer, and a high light-transmission dust-proofing film comprising a polymer having a high refractive index and a polymer having a low refractive index, disclosed in Japanese Unexamined Patent Publication No. 01-262548. An appropriate combination of polymers can be used according to need.

The thickness of the coating layer is appropriately selected according to the properties and functions of the coating film, but the thickness is generally about 30 to about 500 nm.

A coating layer can also be formed on the inner wall surface of the frame 14 according to need.

By bonding the pellicle film 12 to the frame 14 through an adhesive 20 capable of dissolving the above-mentioned coating layer, the pellicle structure 10 of the present invention having the pellicle film 12 bonded to the frame 14 without interposition of the coating layer is fabricated.

The coating layer is generally formed by spin coating or the like, as pointed out above. Accordingly, the coating layer is formed on the entire surface of the pellicle film 12, and therefore, bonding between the pellicle film 12 and the frame 14 is accomplished through this coating layer. However, if bonding between them is performed through the coating layer, a necessary and sufficient bonding strength cannot be obtained and they are peeled from each other at the air-blowing step for removing a foreign substance, as pointed out hereinbefore. As the means for removing the coating layer on the bonded portion of the pellicle film 12, there can be considered a process in which peeling is effected by using an adhesive tape, and a process in which a coating layer is formed while using a mask and the pellicle film 12 is directly bonded to the frame 14. However, these processes are not preferred because troublesome operations are necessary and the productivity of the pellicle structure is reduced.

Figure 2:
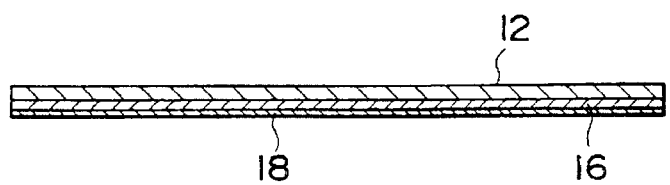
FIG. 2 is a sectional diagram illustrating a process for preparing the pellicle structure shown in FIG. 1.

In contrast, according to the process of the present invention using an adhesive capable of dissolving the coating layer, by bonding the pellicle film 12 to the frame 14 through the adhesive 20 capable of dissolving the coating layer, the coating layer is formed on the entire surface of the pellicle film 12 as shown in FIG. 2, and at the step of bonding the pellicle film 12 to the frame 14, the coating layer is dissolved and removed by the adhesive 20 and included in the interior of the adhesive to embed the coating layer in the adhesive. Then, the adhesive 20 is cured, and the pellicle film 12 can be substantially directly bonded to the frame 14 and as shown in FIG. 1, the pellicle structure 10 comprising the pellicle film bonded to the frame without interposition of the coating layer can be obtained.

If bonding is thus accomplished without interposition of the coating layer in the interface, a sufficient bonding strength can be obtained, and peeling is not caused between the pellicle film and frame even if air blowing is conducted for removing a foreign substance from the surface of the pellicle film. Moreover, the air-blowing pressure can be increased. Accordingly, the photoresist can be efficiently light-exposed in a foreign substance-free state.

The kind of the adhesive 20 used in the present invention is appropriately selected according to the materials of the pellicle film 12 and frame 14 and the material of the coating layer, and the pellicle film 12 can be assuredly bonded to the frame 14. A monomer, an oligomer or a solvent, capable of dissolving the coating layer, is appropriately selected and used according to the materials of the respective members. Furthermore, a mixture of a plurality of monomers, oligomers or solvents can be used, or mixtures with a solvent such as toluene can be used. The monomer, oligomer or solvent to be used should not dissolve, swell or damage the pellicle film. The thickness of the adhesive is in the range of 5 to 100 µm, preferably 10 to 30 µm.

An ethylenically unsaturated monomer having in the molecule at least one group capable of dissolving the coating layer, such as an ether group, an ester group, a keto group, an amide group, a hydrocarbon group or a fluorocarbon group, is appropriately selected and used according to the kind of the coating layer.

Preferred examples of the ethylenically unsaturated monomers will now be mentioned, though monomers that can be used are not limited to those mentioned below.

(A) (Meth)acrylic monomers, especially those represented by the following formula:

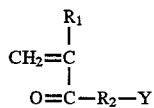

wherein $R_1$ represents a hydrogen atom or an alkyl group having up to 4 carbon atoms, $R_2$ represents a methyl group, an ethyl group or a polyalkylene ether group of formula

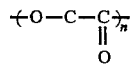

in which n is an integer of from a to 5), and Y represents a mono-valent organic group having at least one oxygen atom, can be mentioned.

As the oxygen atom-containing organic group Y, there can be mentioned an alkoxy group up to 20 carbon atoms, an aryloxy group having 6 to 15 carbon atoms, a group derived from a cyclic ether having about 4 carbon atoms and a group derived from a cyclic ketone having 3 to 7 carbon atoms. Tetrahydrofurfuryl acrylate and phenoxyethyl acrylate are especially preferred.

(B) Styrene monomers, especially those represented by the following formula:

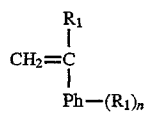

wherein $R_1$ represents a hydrogen atom or an alkyl group having up to 4 carbon atoms, Ph represents a benzene ring, $R_3$ represents a hydrogen atom, an alkyl group, an alkoxy group or a halogen atom, and n is a number of from 1 to 2, such as styrene, α-methylstyrene, vinyltoluene, monomethoxystyrene, dimethoxystyrene, fluorostyrene and divinylstyrene, can be mentioned.

(C) Vinyl ethers, those represented by the following formula:

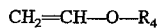

wherein $R_4$ represents an alkyl group having up to 6 carbon atoms, such as methylvinyl ether and isobutylvinyl ether, can be mentioned.

(D) Vinyl ketones, especially those represented by the following formula:

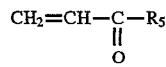

wherein $R_5$ represents an alkyl group having up to 6 carbon atoms, such as methylvinyl ketone and isobutylvinyl ketone, can be mentioned.

(E) Other monomers such as acrylamide and vinyl trifluoroacetate can be mentioned.

These monomers can be used singly or in the form of a mixture of two or more of them, and appropriate monomers are selected and used according to the kinds of the coating material and pellicle film used.

These monomers are combined with adhesive base resins and used in the form of adhesive compositions. The base resin should be soluble in these monomers and be polymerizable or crosslinkable with these monomers.

As preferred examples of the base resin, there can be mentioned a thermosetting acrylic resin, an unsaturated polyester resin, an epoxy resin, a thermosetting vinyl resin, a polyurethane resin, an acrylurethane resin, a polyesterurethane resin, an epoxy-modified acrylic resin, an epoxy-modified vinyl resin, an epoxy-modified polyester resin and a bismaleimide resin.

Preferably, the base resin has a relatively low molecular weight so that the base resin is soluble in the monomer, and the base resin has in the molecule a polymerizable group and an ethylenically unsaturated group.

The mixing ratio between the base resin and the monomer is decided so that the base resin and the monomer are compatible with each other, the coating layer can be dissolved and removed, a sufficient initial bonding force can be attained and a strong final bonding force can be obtained. It is generally preferred that the content of the monomer in the adhesive composition be 5 to 30% by weight and the content of the base resin be 95 to 70% by weight.

A polymerization or curing initiator is incorporated into the adhesive to be used. As the initiator, there can be mentioned, for example, hydroxyalkylphenyl ketone compounds such as 1-phenyl-2-hydroxy-2-methylpropan-1-one, 1-(4-isopropylphenyl)-2-hydroxy-2-methylpropan-1-one and 1-(4-tert-butylphenyl)-2-hydroxy-2-methylpropan-1-one, and other photopolymerization initiators.

As the polymerization initiator, there can be mentioned, for example, organic peroxides such as diisopropyl peroxydicarbonate, di-sec-butyl peroxydicarbonate, dicyclohexyl peroxydicarbonate, tert-butyl perbenzoate, benzoyl peroxide, acetyl peroxide t-butyl hydroperoxide, cumene hydropheroxide, di-t-butyl peroxide, t-butyl peroxybenzoate, lauroyl peroxide, diisopropyl peroxydicarbonate, methylethyl ketone peroxide and diacyl peroxide, and azo compounds such as azobisisobutyronitrile and azobismethylisovaleronitrile. These initiators can be used singly or in combination according to need.

The initiator is preferably used in a catalytic amount, that is, 1 to 5% by weight based on the composition. In view of the speed and facility of the bonding operation, use of a photopolymerizable adhesive is preferably used.

In the case where the pellicle film 12 is composed of nitrocellulose and the coating layer is composed of a fluorine resin, an adhesive formed by adding 5 to 30% by weight of tetrahydrofurfuryl acrylate or phenoxyethyl acrylate capable of dissolving the fluorine resin coating layer into a urethane acrylate resin or isobornyl acrylate ordinarily used as a base for a photocurable adhesive is preferably used.

In the adhesive composition used in the present invention, various solvents can be further incorporated in addition to the foregoing components for assisting or enhancing the dissolution of the coating layer. As the solvent, there can be mentioned aromatic hydrocarbon solvents, ether solvents, ester solvents, ketone solvents and amide solvents. These solvents can be used singly or in the form of mixtures of two or more of them. Preferably, the solvent is used in a weight of 0.1 to 0.7 time the solid of the adhesive.

For example, in the case where the coating layer of the pellicle film comprises a first coating layer composed of a polymer of an aromatic compound and a second coating layer composed of a fluorine resin, use of an adhesive composition comprising (A) an adhesive comprising 70 to 95 parts by weight of a base resin and 5 to 30 parts by weight of a monomer or oligomer capable of dissolving the fluorine resin coating layer and (B) an aromatic hydrocarbon solvent at a (B)/(A) weight ratio of from 0.1 to 0.7 is preferred.

Figure 3:
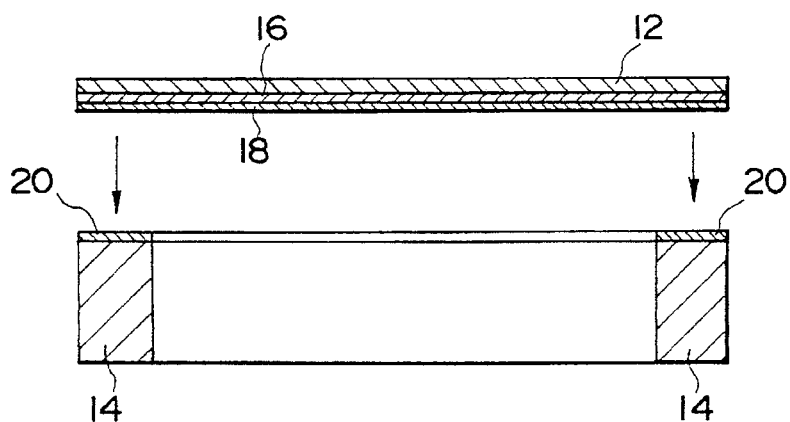
FIG. 3 is a sectional diagram illustrating a process for preparing the pellicle structure shown in FIG. 1.
Figure 4:
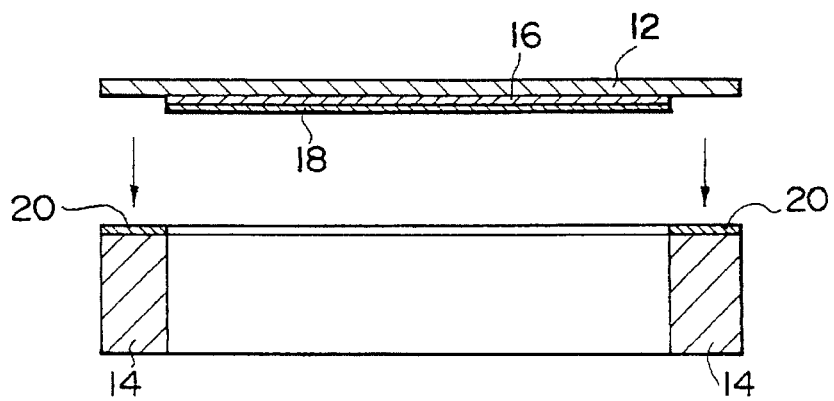
FIG. 4 is a sectional diagram illustrating a process for preparing the pellicle structure shown in FIG. 1.

Referring to FIGS. 2 and 3 illustrating the production of the pellicle structure, a first coating layer 16 and a second coating layer 18 are formed on at least one surface of the pellicle film 12 by spin coating, dip coating, roll coating or the like, as shown in FIG. 2.

Then, as shown in FIG. 3, the adhesive 20 of the present invention is coated on the top end face of the frame 14, which is a portion to be bonded to the pellicle film 12. As pointed out hereinbefore, the adhesive 20 should be capable of dissolving the above-mentioned coating layer therein.

Then, the bonding portion of the frame 14 is closely contacted to the pellicle film 12, and the adhesive 20 is cured according to a process suitable for the adhesive 20 used, such as ultraviolet ray irradiation or heating whereby a pellicle structure 10 of the present invention is obtained.

EXAMPLES

The present invention will now be described in detail with reference to the following examples that by no means limit the scope of the invention.

Examples 1 through 3

At first, a first coating layer 16 composed of an alkylnaphthalene polymer was spin-coated on one surface of a pellicle film 12 of nitrocellulose having a thickness of 2850 nm, and then, a second coating layer 18 composed of fluorine resin was formed. The thickness of the first coating layer 16 was 65 nm and the thickness of the second coating layer 18 was 80 nm.

By using the so-prepared pellicle film 12, pellicle structures of Examples 1 through 3, Comparative Example 1 and 2 and Referential Examples 1 through 5 were prepared.

By using a 1/1 (weight ratio) mixture of an adhesive having a composition shown in Table 1 and toluene, the pellicle film 12 was bonded to a frame (alumite-treated aluminum) to prepare a pellicle structure 10 of the present invention.

TABLE 1

| Composition (% by weight) of adhesive | | Referential Example 1 Example 1 | Referential Example 2 Example 2 | Referential Example 3 Example 3 | Referential Example 4 Comparative Example 1 | Referential Example 5 Comparative Example 2 |
|---|---|---|---|---|---|---|
| Urethane-acryl prepolymer* | (A) | 51 | — | — | 61 | — |
| | (B) | — | 51 | — | — | — |
| | (C) | — | — | 46 | — | 61 |
| Epoxy acrylate | | — | — | — | — | — |
| Isoboronyl acrylate | | 30 | 35 | 25 | 35 | 35 |
| Tetrahydroflufuryl acrylate | | 15 | 5 | — | — | — |
| Phenoxyethyl acrylate | | — | 5 | 25 | — | — |
| Mono-(2-acryloyloxyethyl)caid-phosphate | | 1 | 1 | 1 | 1 | 1 |
| Methylphenyl glyoxy ester | | 3 | 3 | 3 | 3 | 3 |
| Hydroquinone monomethyl ether | | 0.01 | 0.01 | 0.01 | 0.01 | 0.01 |
| Total | | 100 | 100 | 100 | 100 | 100 |

Note

Preparation of Urethane-Acrylic Prepolymer

In a reaction vessel, polypropylene glycol having an average molecular weight of 2,000 and tolylene diisocyanate were reacted at a molar ration of 0.5/1 at a temperature of 80° C. for 2 hours. Then, the reaction mixture was reacted with 1 mole of hydroxypropyl acrylate at 80° C. for 3 hours to obtain a urethane-acrylic prepolymer (A) in the form of a viscous liquid.

In reaction vessel, a hydroxyl-terminated polybutadiene having an average molecular weight of 3,000 and tolylene diisocyanate were reacted at a molar ratio of 0.5/1 at a temperatures of 80° C. for 2 hours. Then, the reaction mixture was reacted with 1 mole of hydroxyethyl acrylate at 80° C. for 3 hours to obtain a urethane-acrylic prepolymer (B) in the form of a viscous liquid.

In a reaction vessel, polymethylene glycol having an average molecular weight of 2,000 and isopherone diisocyanate were reacted at a molar ratio of 0.5/1 at a temperature of 80° C. for 2 hours. Then, the reaction mixture was reacted with 1 mole of hydroxyethyl acrylate at 80° C. for 3 hours to obtain a urethane-acrylic prepolymer (C) in the form of a viscous liquid.

At the bonding step, the bonding portion of the frame 14 was bonded to the pellicle film 12, and the bonding portion was pressed for 30 seconds and irradiated with 2,000 mj/cm$^2$ to effect curing the adhesive 20.

When the bonding portion between the pellicle film 12 and the frame 14 was examined with the naked eye, it was confirmed that the coating layer was substantially dissolved and removed, and the pellicle film 12 was substantially directly bonded to the frame 14. In the adhesive of the present invention, the toluene component exerted the function of dissolving and removing the first coating layer 16 composed of the alkylnaphthalene polymer, and the tetrahydrofurfuryl acrylate component exerted the function of dissolving and removing the second coating layer 18 composed of the fluorine resin.

Comparative Examples 1 and 2

By using an adhesive having a composition shown in Table 1, the above-mentioned pellicle film 12 and frame 14 were bonded, and immediately, the adhesive was cured by a high-pressure mercury lamp light to bond the pellicle film 12 to the frame 14 through the coating layer to form a pellicle structure. The adhesive was used in the form of a 1/1 (weight ratio) mixture with toluene.

Referential Examples 1 through 5

The pellicle film 12 having no coating layer was used, and the pellicle film 12 was similarly bonded by using the adhesive shown in Table 1.

With respect to each of the obtained pellicle structures, the bonding strength between the pellicle film 12 and the frame 14 was measured. The measurement was conducted by carrying out air blowing the pellicle film 12 and the frame 14. The obtained results are shown in Table 2.

Incidentally, air blowing was carried out at four points, and the average value was calculated.

As is seen from the results shown above, the bonding strength of the pellicle structure formed by bonding the pellicle film 12 to the frame 14 through the coating layer was 1.2 kgf/cm$^2$ In contrast, the bonding strength of the pellicle structure of the present invention obtained by bonding the pellicle film 12 substantially directly to the frame 14 was comparable to that of the pellicle structure having no coating layer and was at least three times the bonding strength of the pellicle film obtained by effecting bonding through the coating layer.

Therefore, it is apparent that excellent effects can be attained by the present invention.

As is apparent from the foregoing description, although the pellicle structure of the present invention has a coating layer exerting a function of removing a foreign substance or preventing reflection of the exposure light, a sufficient bonding strength is attained between the pellicle film and the frame, and even if air blowing or the like is carried out for removing a foreign substance from the surface of the pellicle film, peeling is not caused between the pellicle film and the frame. Moreover, removal of the foreign substance is effectively performed by increasing the air blow pressure, and therefore, a photoresist can be light-exposed efficiently in a foreign substance-free state.

We claim:

1. A pellicle structure comprising
   (A) a frame having a vertical through opening,
   (B) a pellicle film, which is capable of being used in a resist process of photolithography and has a high exposed light transmission, spread on an upper end of said opening of said frame, said pellicle film comprising a substrate film layer of a cellulose derivative and a coating layer of a fluorine resin formed at least on an inner surface of said substrate film layer, and
   (C) a bonding portion for bonding an end edge of said frame to a peripheral edge of said pellicle film through an adhesive layer, wherein said coating layer of a fluorine resin in said bonding portion is dissolved or dispersed in said adhesive layer and said substrate film layer of a cellulose derivative, which is not dissolved in said adhesive layer, is directly contacted with and bonded to said adhesive layer, wherein an adhesive of said adhesive layer is a photocurable composition comprising
      (i) a base resin selected from the group consisting of a urethane acrylate resin and isobornyl acrylate resin, and
      (ii) an ethylenically unsaturated monomer or an oligomer thereof capable of dissolving or dispersing said

TABLE 2

| Test Item | | | | | | |
|---|---|---|---|---|---|---|
| | Adhesive | Example 1 | Example 2 | Example 3 | Comparative Example 1 | Comparative Example 2 |
| Bonding Strength (kgf/cm$^2$) | Pellicle film: nitrocellulose Coating layer: fluorine resin Frame: aluminum | at least 4.5 | at least 4.5 | at least 4.5 | 1.2 | 1.0 |
| | Adhesive | Referential Example 1 | Referential Example 2 | Referential Example 3 | Referential Example 4 | Referential Example 5 |
| | Pellicle film: nitrocellulose Coating layer: not formed Frame: aluminum | at least 4.5 | at least 4.5 | at least 4.5 | at least 4.5 | at least 4.5 | fluorine resin therein but not capable of dissolving or dispersing said cellulose derivative therein.

2. A pellicle structure as set forth in claim 1, wherein the adhesive is a photocurable resin adhesive comprising 70 to 95% by weight of a base resin and 5 to 30% by weight of a monomer or oligomer capable of dissolving a fluorine resin coating layer therein.

3. A pellicle structure as set forth in claim 2, wherein the base resin of the photocurable adhesive is an adhesive base selected from the group consisting of a urethane acrylate resin and an isoboronyl acrylate resin, and the component capable of dissolving the fluorine resin coating is selected from the group consisting of tetrahydrofurfuryl acrylate and phenoxyethyl acrylate.

4. A process for the preparation of a pellicle structure, which structure comprises a frame having a vertical through opening, a pellicle film, which is capable of being used in a resist process of photolithography and has a high exposed light transmission, spread on an upper end of said opening of said frame, said film comprising a substrate film layer of a cellulose derivative and a coating layer of a fluorine resin formed at least on an inner surface of said substrate film layer, and a bonding portion for bonding an end edge of said frame to a peripheral edge of said pellicle film through an adhesive layer, said process comprising the steps of:

coating an adhesive, capable of dissolving therein said coating layer of a fluorine resin and not capable of dissolving said substrate film layer of cellulose derivative therein, on said upper end of said opening of said frame having said vertical through opening;

contacting said adhesive-coated surface of said frame with a surface of said coating layer of a fluorine resin formed on said inner surface of said substrate film layer at said peripheral edge of said pellicle film;

dissolving said coating layer of a fluorine resin contacted with said adhesive-coated surface of said frame into said adhesive; and curing said adhesive on said coated surface, whereby said substrate film layer is directly bonded to said frame without interposing a coating layer, wherein said adhesive is a photocurable composition comprising
  (i) a base resin selected from the group consisting of a urethane acrylate resin and an isoboronyl acrylate resin, and
  (ii) an ethylenically unsaturated monomer or oligomer thereof capable of dissolving said fluorine resin therein but not capable of dissolving said cellulose derivative therein.

5. A process for the preparation of a pellicle structure according to claim 4, wherein the adhesive is composed of a photocurable resin composition comprising 70 to 95% by weight of the base resin and 5 to 30% by weight of the monomer or oligomer capable of dissolving the fluorine resin coating layer therein.

6. A process for the preparation of a pellicle structure according to claim 5, wherein the base resin of the photocurable adhesive is a base resin selected from the group consisting of a urethane acrylate resin and an isoboronyl acrylate resin, and the monomer component capable of dissolving the fluorine resin coating layer is a component selected from the group consisting of tetrahydrofurfuryl acrylate and phenoxyethyl acrylate.

7. A process for the preparation of a pellicle structure according to claim 4, wherein the coating layer of the pellicle film comprises a first coating layer composed of a polymer of an aromatic compound and a second coating layer composed of a fluorine resin, and the adhesive containing the monomer or oligomer component capable of dissolving the coating layer therein comprises (A) an adhesive comprising 70 to 95 parts by weight of the base resin and 5 to 30 parts by weight of a monomer or oligomer capable of dissolving the fluorine resin coating layer therein and (B) an aromatic hydrocarbon solvent at a (B)/(A) weight ratio of from 0.1 to 0.7.

8. A process for the preparation of a pellicle structure according to claim 7, wherein the aromatic hydrocarbon solvent is an alkylbenzene.

* * * * *